United States Patent
Yamamoto et al.

(10) Patent No.: US 7,692,470 B2
(45) Date of Patent: Apr. 6, 2010

(54) LEVEL CONVERSION CIRCUIT WITH LOW CONSUMPTION CURRENT CHARACTERISTICS

(75) Inventors: Shinji Yamamoto, Osaka (JP); Toshihiko Takeda, Hyogo (JP); Taketo Kunihisa, Osaka (JP)

(73) Assignee: Panasonic Corporation, Osaka (JP)

( * ) Notice: Subject to any disclaimer, the term of this patent is extended or adjusted under 35 U.S.C. 154(b) by 10 days.

(21) Appl. No.: 12/181,729

(22) Filed: Jul. 29, 2008

(65) Prior Publication Data

US 2009/0033402 A1 Feb. 5, 2009

(30) Foreign Application Priority Data

Jul. 30, 2007 (JP) .............................. 2007-197555

(51) Int. Cl.
*H03L 5/00* (2006.01)
(52) U.S. Cl. ...................................... 327/333; 327/308
(58) Field of Classification Search ................. 327/308, 327/333; 326/62
See application file for complete search history.

(56) References Cited

U.S. PATENT DOCUMENTS

| | | | | |
|---|---|---|---|---|
| 4,703,205 A | * | 10/1987 | Heimbigner | ................. 326/68 |
| 4,791,322 A | | 12/1988 | Graham et al. | |
| 4,844,563 A | * | 7/1989 | MacMillan et al. | ........... 326/70 |
| 4,945,258 A | * | 7/1990 | Picard et al. | ................. 327/109 |
| 5,045,727 A | * | 9/1991 | Danckaert et al. | ............. 326/68 |
| 5,210,504 A | | 5/1993 | Yagita et al. | |
| 5,420,527 A | * | 5/1995 | Naber | ......................... 326/32 |
| 6,051,993 A | * | 4/2000 | Miyashita | ..................... 326/80 |
| 6,605,974 B2 | * | 8/2003 | Brandt | ........................ 327/333 |

FOREIGN PATENT DOCUMENTS

| | | |
|---|---|---|
| JP | 3-19426 | 1/1991 |
| JP | 4-108216 | 4/1992 |

* cited by examiner

*Primary Examiner*—Kenneth B. Wells
(74) *Attorney, Agent, or Firm*—McDermott Will & Emery LLP

(57) ABSTRACT

A level conversion circuit according to the present invention comprises: a first transistor having a gate thereof grounded, for inputting the input voltage to a source thereof and outputting an output voltage from a drain thereof; a second transistor having a drain thereof to which a power supply voltage is applied, for inputting the output voltage outputted from the drain of the first transistor to a gate thereof and outputting, from a source thereof, the output voltage determined by the power supply voltage; a level shift circuit for inputting the output voltage outputted from the source of the second transistor to an input end thereof and outputting, from an output end thereof, a voltage whose level is shifted by a predetermined amount; and a resistance inserted between the output end of the level shift circuit and a ground. Thus, it becomes possible to reduce a current Ii flowing to the gate of the first transistor to a level close to zero.

10 Claims, 16 Drawing Sheets

(a)

(b)

(c)

(a)

(b)

(c)

(a)

(b)

(c)

(a)

(b)

(c)

(a)

(b)

(c)

(a)

(b)

(c)

(a)

(b)

LEVEL CONVERSION CIRCUIT WITH LOW CONSUMPTION CURRENT CHARACTERISTICS

BACKGROUND OF THE INVENTION

1. Field of the Invention

The present invention relates to a level conversion circuit connected to a logic circuit included in a radio-frequency signal switching device used in a communication terminal apparatus (a cellular telephone, wireless communication unit or the like).

2. Description of the Background Art

In recent years, there has been an increased demand that a radio-frequency signal switching device be of a multi-input multi-output type. The radio-frequency signal switching device of this type requires a logic circuit. The logic circuit outputs a signal to any of four output terminals corresponding, respectively, to four types of combinations (00, 01, 10, 11) of input signals, each having two bits, for example.

However, a voltage range as "Low" and a voltage range as "High", both of which are allowable for the logic circuit does not necessarily coincide with a voltage range of a signal outputted from a circuit provided preceding to the logic circuit. For example, when a baseband circuit provided preceding to the logic circuit is a C-MOS output circuit, "Low" is 0V and "High" is 1.8V or more, while when the logic circuit is a gallium arsenide metal semiconductor field-effect transistor (GaAs-MESFET), "Low" is 0V and "High" is approximately 0.2V or more, for example. Under such circumstances, a level conversion circuit is necessary to be provided.

FIG. 13 is a diagram illustrating an example of a schematic structure of a radio-frequency signal switching device including a level conversion circuit. In an example shown in FIG. 13, a SW circuit 140 has one input and four outputs. A baseband circuit 110 outputs a control signal for which the SW circuit 140 selects any one of paths SW-A to SW-D. In this example, since four paths are provided in the SW circuit 140, two signal output lines (2 bits) are used. A signal having a frequency significantly lower than that of a signal passing through the SW circuit 140 is used as the control signal outputted from the baseband circuit 110.

A level conversion circuit 120 inputs two control signals outputted from the baseband circuit 110, converts voltage levels of the respective signals into those which allow a logic circuit 130 to operate in an appropriate manner, and then outputs the signals thus obtained. The logic circuit 130 further converts the converted signals outputted from the level conversion circuit 120 into four switching signals and outputs the four switching signals having been converted. For example, among combinations of a Low level "0" and a High level "1" of the two respective converted signals, the logic circuit 130 assigns "00", "01", "10" and "11" to a switching signal A, a switching signal B, a switching signal C and a switching signal D, respectively, and selects any one of the paths SW-A to SW-D included in the SW circuit 140 based on the switching signals A to D (i.e., turns the SW circuit 140 on).

FIG. 14 is a diagram illustrating an exemplary structure of the conventional level conversion circuit 120. The number of the level conversion circuit 120 to be provided is determined in accordance with the number of control signals outputted from the baseband circuit 110. Thus, in the aforementioned example, two level conversion circuits 120 are provided. FIG. 15 is a diagram illustrating an input-output characteristic of the conventional level conversion circuit 120 shown in FIG. 14.

Between an input terminal 151 which inputs a control signal outputted from the baseband circuit 110 and the ground, a bleeder resistance (R1) 121, a level shift circuit 122 and a bleeder resistance (R2) 123, all of which are connected in series with each other, are inserted. An output terminal 152 is connected to an output side k of the level shift circuit 122. A relationship between an input voltage Vi of the input terminal 151 and an output voltage V0 of the output terminal 152, i.e., an inclination of the characteristic shown in FIG. 15 is determined based on a resistance division ratio of the bleeder resistance 121 to the bleeder resistance 123. Specifically, $Vo=Vi \times R2/(R1+R2)$ is satisfied in region B.

The level shift circuit 122 defines the input voltage Vi obtained when the output voltage Vo starts to appear at the output terminal 152, i.e., an inclination start position Vi(L) of the characteristic shown in FIG. 15, in region A, Vo is 0V. The level shift circuit 122 is used for increasing a switching margin in the case where the input voltage Vi is a logic value "Low". When a diode is used, for example, as the level shift circuit 122, a value ranging approximately from 0.5V to 0.6V will be obtained.

FIG. 16 is a diagram illustrating a simulation result obtained when using the conventional level conversion circuit 120 shown in FIG. 14. During a simulation, the bleeder resistance 121 and the bleeder resistance 123 are set at 300 kΩ and 600 kΩ, respectively, and a GaAs-MESFET having a Schottky gate is used as a diode of the level shift circuit 122.

(a) of FIG. 16 shows a characteristic of the input voltage Vi versus the output voltage Vo of the conventional level conversion circuit 120. The GaAs-MESFET having the Schottky gate (Φb to about 0.4V) is used as a diode, and thus the output voltage V0 rises up (appears) from approximately 0.4V.

For example, it is assumed that the logic circuit 130 using an enhancement type GaAs-MESFET is provided subsequent to the level conversion circuit 120, and a threshold value Vth of the logic circuit 130 is +0.2V. In this case, a voltage level is set as an input Low level because the output voltage Vo is 0V when the input voltage Vi is within a range from 0 to about 0.4V(=Vi(L)), while the voltage level is set as an input High level because the output voltage Vo is 0.66V or more when the input voltage Vi is 1.5V(=Vi(H)) or more. Thus, it is possible to realize a level conversion circuit capable of outputting a voltage less than or equal to the threshold value Vth when the voltage level is the input Low level, and also capable of outputting a voltage greater than the threshold value Vth when the voltage level is the input High level.

(b) of FIG. 16 shows a characteristic of the input voltage Vi versus an inflow current Ii (a current flowing from the input terminal 151) of the conventional level conversion circuit 120. The inflow current Ii starts to flow at the same time when the input voltage Vi rises up. As is clear from (b) of FIG. 16, when the input voltage Vi is 1.5V, a current of 1.1 µA flows from the input terminal 151, while when the input voltage Vi is 5.0V, a current of 4.9 µA flows from the input terminal 151.

The simulation result of the conventional level conversion circuit 120 is shown in a table 1 below.

TABLE 1

| Vo where Vi = 1.5 V | Ii where Vi = 1.5 V | Ii where Vi = 5.0 V |
|---|---|---|
| 0.66 V | 1.1 µA | 4.9 µA |

Moreover, these days, the miniaturization of LSIs which are mounted on a portable terminal has advanced, and the power consumption of digital circuits such as the baseband circuit 110 has been reduced accordingly. Under such circumstances, an allowable current value of an output terminal included in the baseband circuit 110 also tends to decease. Therefore, in order to decrease the inflow current Ii flowing to the level conversion circuit 120, the prior arts using the bleeder resistances 121 and 123 mentioned above are under pressure to increase values of the bleeder resistances 121 and 123. For reducing a current value to one-tenth thereof, it is necessary to increase the value of the bleeder resistance by ten times.

However, in the case where a sheet resistance of approximately 1 kΩ/□ is used in the semiconductor processing, it is inevitable, in a method of increasing this resistance value, that a chip area be increased in accordance with an increase in the resistance value even if a resistance value is only several hundreds of kΩ.

SUMMARY OF THE INVENTION

Therefore, an object of the present invention is to provide a level conversion circuit capable of reducing to a minimum an inflow current flowing from an input terminal without increasing a chip area.

The present invention is directed to a level conversion circuit which converts a level of an input voltage and outputs a voltage whose level has been converted. In order to attain the object mentioned above, the level conversion circuit of the present invention comprises: a first transistor having a gate thereof grounded, for inputting the input voltage to a source thereof and outputting an output voltage from a drain thereof; a second transistor having a drain thereof to which a power supply voltage is applied, for inputting the output voltage outputted from the drain of the first transistor to a gate thereof and outputting, from a source thereof, the output voltage determined by the power supply voltage; a level shift circuit for inputting the output voltage outputted from the source of the second transistor to an input end thereof and outputting, from an output end thereof, a voltage whose level is shifted by a predetermined amount; and a resistance inserted between the output end of the level shift circuit and a ground.

Alternatively, the level conversion circuit may further comprise a third transistor having a gate thereof grounded and a drain thereof to which a power supply voltage is applied, for outputting, from a source thereof, the output voltage determined by the power supply voltage, and cause the second transistor to input the output voltage outputted from the source of the third transistor to the drain of the second transistor. Still alternatively, the level conversion circuit may further comprise a second resistance for inputting the output voltage outputted from the source of the third transistor to an input end thereof and outputting, from an output end thereof, the output voltage determined by the power voltage, and cause the second transistor to connect the output end of the second resistance to the drain of the second transistor.

Typically, each of the first to third transistors is a gallium arsenide metal semiconductor field-effect transistor, and the level shift circuit is a diode. In this case, the level shift circuit preferably uses a gallium arsenide metal semiconductor field-effect transistor having a Schottky gate as the diode. Furthermore, it is preferable that in the semiconductor integrated circuit, a semiconductor chip on which the level conversion circuit is integrated is the same as that on which a radio-frequency signal switching device to which the level conversion circuit is connected to.

According to the present invention, it becomes possible to suppress inflow currents flowing from an input terminal to a level conversion circuit and also flowing from a power terminal to the level conversion circuit, without increasing a chip area.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 13:
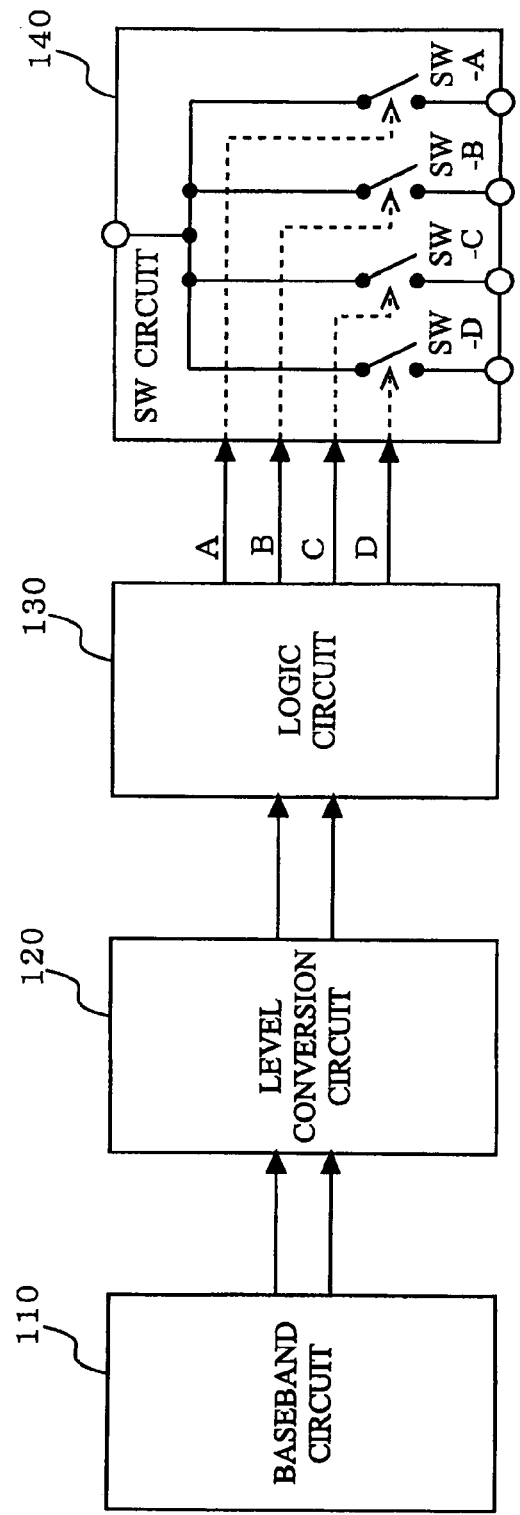
FIG. 13 is a diagram illustrating an exemplary structure of a radio-frequency signal switching device including a level conversion circuit.
Figure 14:
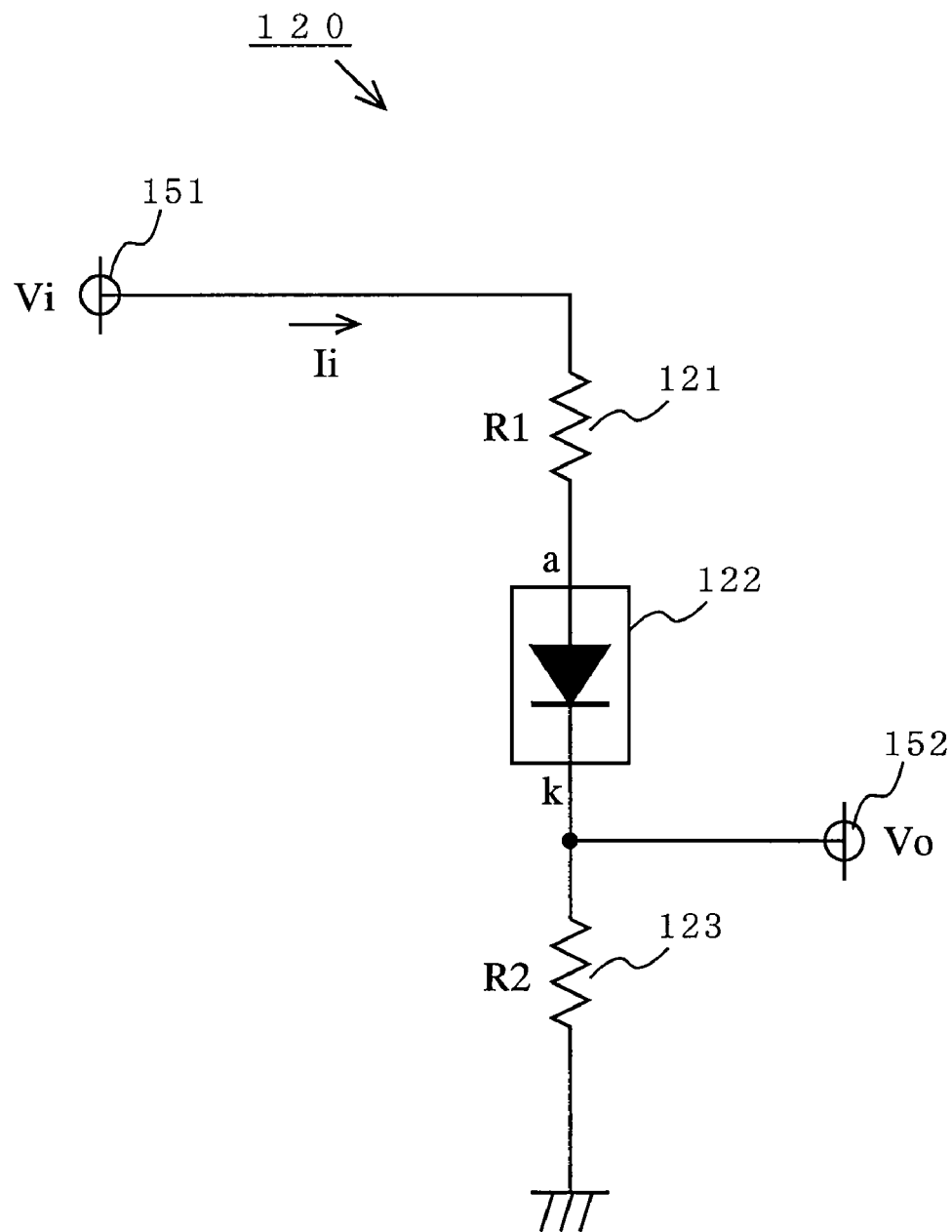
FIG. 14 is a diagram illustrating an exemplary structure of a conventional level conversion circuit 120.
Figure 15:
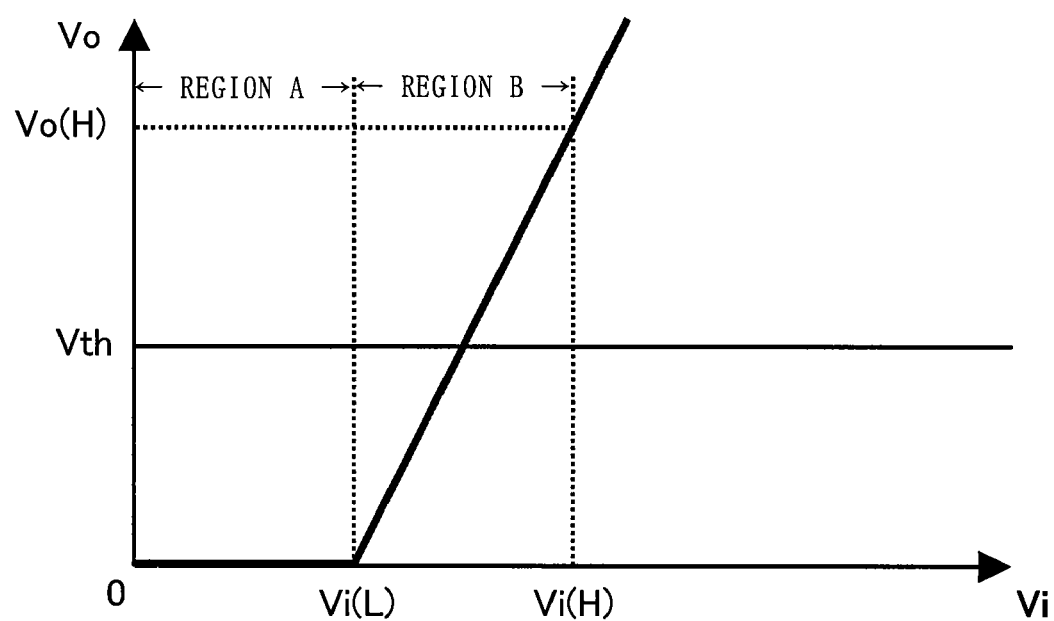
FIG. 15 is a diagram illustrating an input-output characteristic of the conventional level conversion circuit 120 shown in FIG. 14.

Hereinafter, embodiments of the present invention will be described with reference to the drawings. Note that a radio-frequency signal switching device including a level conversion circuit of the present invention has the same structure as that which has been described with reference to FIG. 13 in the "Description of Background Art". Therefore, any description thereof will be omitted.

First Embodiment

Figure 1:
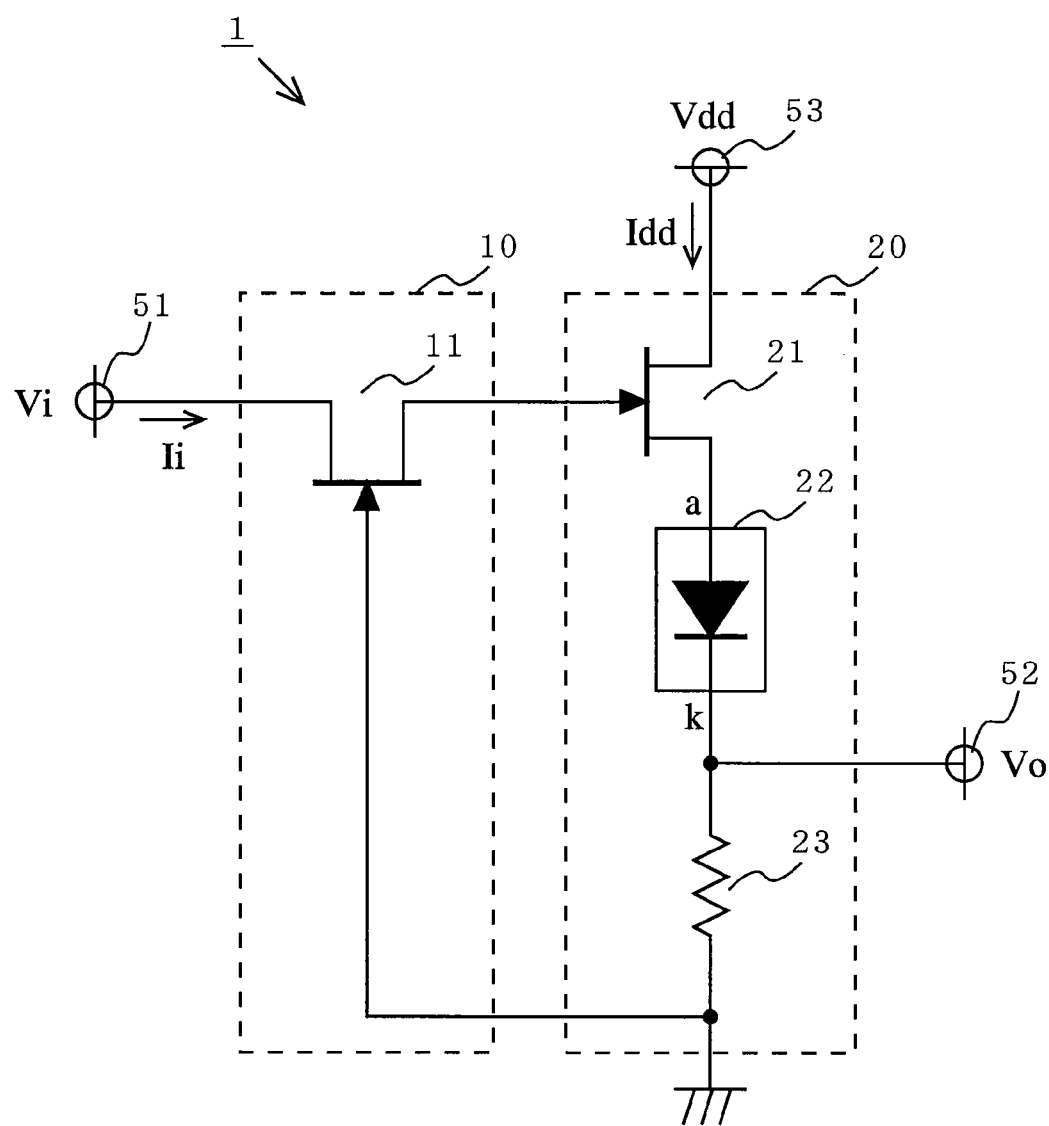
FIG. 1 is a diagram illustrating a structure of a level conversion circuit 1 according to a first embodiment of the present invention.

FIG. 1 is a diagram illustrating a structure of a level conversion circuit 1 according to a first embodiment of the present invention. In FIG. 1, the level conversion circuit 1 comprises a gate grounded circuit 10 and a source follower circuit 20. The gate grounded circuit 10 includes a field-effect transistor (FET) 11 whose gate is grounded for radio-frequency components. The source follower circuit 20 includes a FET 21 whose drain is grounded for radio-frequency components, a level shift circuit 22, and a source follower load resistance 23.

A source of the FET 11 is connected to an input terminal 51, while a drain of the FET 11 is connected to a gate of the FET 21. A drain of the FET 21 is connected to a power supply terminal 53, while a source of the FET 21 is connected to an input side "a" of the level shift circuit 22. The output side "k" of the level shift circuit 22 is connected to the output terminal 52 and grounded via the source follower load resistance 23.

Hereinafter, an operation of the level conversion circuit 1 having a connection structure mentioned above. Note that a voltage of an input signal applied to the input terminal 51, a current flowing from the input terminal 51, a voltage appeared at the output terminal 52, a voltage applied to the power supply terminal 53 and a current flowing from the power terminal 53 are denoted as the input voltage Vi, the inflow current Ii, the output voltage Vo, a power voltage Vdd and an inflow current Idd, respectively.

Since the source follower circuit 20 is in a high impedance input state, and uses the FET 21, the inflow current Ii becomes less than or equal to the order of µA. When the input voltage Vi becomes too high, the gate grounded circuit 10 absorbs the input voltage with a voltage drop of a drain-source voltage Vds of the FET 11, thereby preventing a gate voltage of the FET 21 from becoming higher than necessary. The level shift circuit 22 shifts a position at which the output voltage Vo rises up in an appropriate manner.

Figure 2:
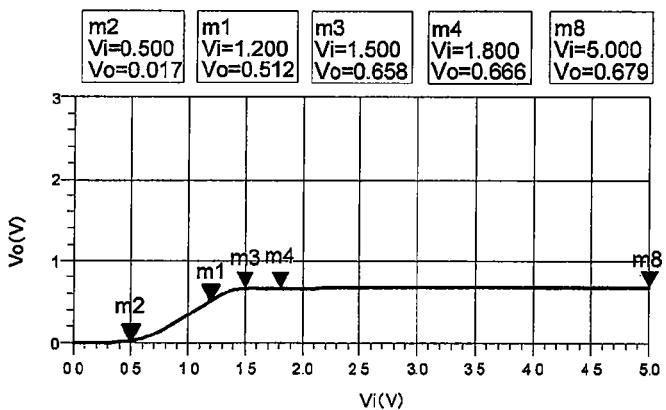
FIG. 2 is a diagram illustrating a simulation result obtained when using the level conversion circuit 1 shown in FIG. 1.
Figure 2:
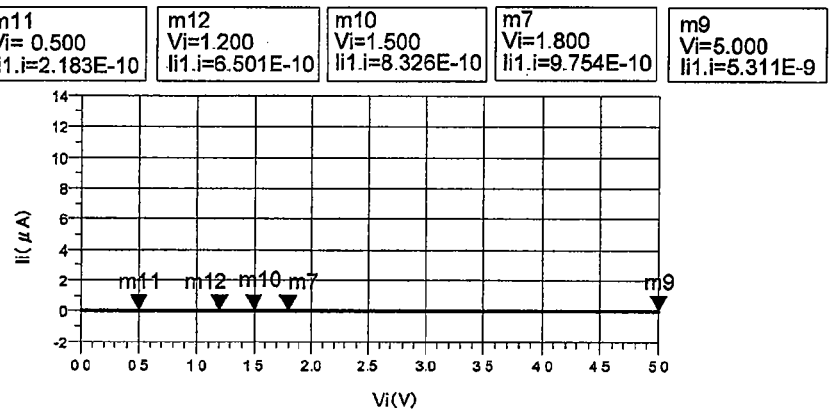
Figure 2:
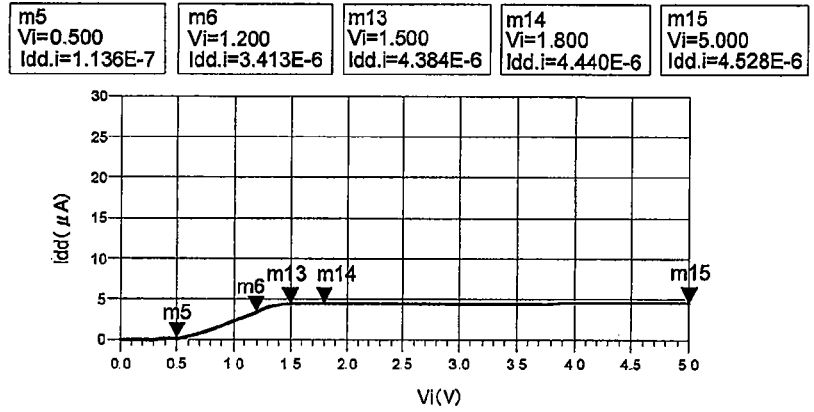

(a) to (c) of FIG. 2 is a diagram illustrating a simulation result obtained when using the level conversion circuit 1. During a simulation, the GaAs-MESFET is used as each of the FETs 11 and 21, the source follower load resistance 23 is set at 150 kΩ, the GaAs-MESFET having the Schottky gate is used as a diode of the level shift circuit 22, and the power voltage Vdd is set at 2.7V.

Figure 16:
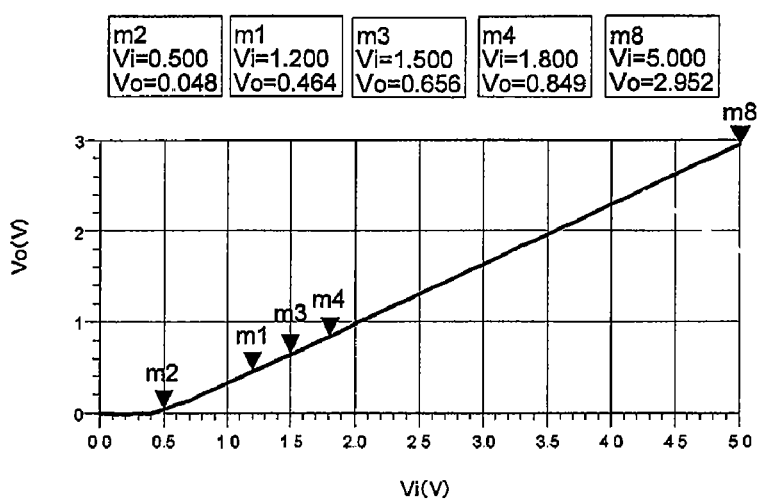
FIG. 16 is a diagram illustrating a simulation result obtained when using the conventional level conversion circuit 120 shown in FIG. 14.
Figure 16:
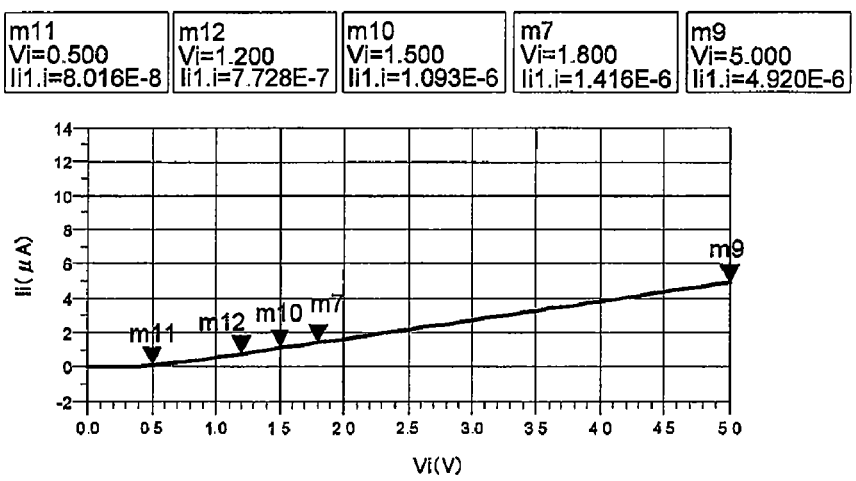

(a) of FIG. 2 shows a characteristic of the input voltage Vi versus the output voltage Vo of the level conversion circuit 1. The GaAs-MESFET having the Schottky gate (Φb to 0.4V) is used as a diode, and thus the output voltage Vo rises up (appears) from approximately 0.4V. Furthermore, when it is assumed that a logic circuit using an enhancement type GaAs-MESFET is provided subsequent to the level conversion circuit 1, and a threshold value Vth of the logic circuit is +0.2V, a voltage level is set as an input Low level when the input voltage Vi is within a range from 0 to about 0.4V, while the voltage level is set as an input High level when the input voltage Vi is 1.5V or more. Thus, it is possible to realize a level conversion circuit capable of outputting a voltage less than or equal to the threshold value Vth when the voltage level is the input Low level, and also capable of outputting a voltage greater than the threshold value Vth when the voltage level is the input High level. This is the same as the characteristic obtained when using the conventional level conversion circuit 120 (see FIG. 16).

However, in the present invention, the characteristic shown in (a) of FIG. 2 is different from that obtained when using the conventional level conversion circuit 120 in that the output voltage V0 shown in (a) of FIG. 2 remains saturated even when the input voltage Vi becomes 1.5V or more. Generally, the maximum input voltage rating suitable for a logic circuit subsequent to the level conversion circuit is provided. Therefore, the characteristic shown in (a) of FIG. 2 of the present invention will be of considerable benefit to the reliability of circuit operations.

Furthermore, (b) of FIG. 2 shows a characteristic of the input voltage Vi versus the inflow current Ii of the level conversion circuit 1. When the input voltage Vi is 1.5V, the inflow current Ii is 0.8 pA, which realizes a small current value approximately less than or equal to one-thousandth of that of the conventional level conversion circuit 120 described above. Furthermore, even when the input voltage Vi is 5.0V, the inflow current Ii is 5.3 pA, which is also reduced to approximately one-thousandth of a current value of the conventional level conversion circuit 120 described above. As described above, in the present invention, it becomes possible to reduce the inflow current Ii to a level close to zero.

Furthermore, (c) of FIG. 2 shows a characteristic of the input voltage Vi versus the inflow current Idd of the level conversion circuit 1. The level convention circuit 1 according to the present invention is different from the conventional level conversion circuit 120 in that the level conversion circuit 1 has the power supply terminal 53 and the inflow current Idd is consumed from the power supply terminal 53. According to (c) of FIG. 2, when the input voltage Vi is 1.5V, the inflow current Idd is 4.4 µA.

The simulation result of the level conversion circuit 1 according to the first embodiment is shown in a table 2 below.

TABLE 2

| Vo where Vi = 1.5 V | Ii where Vi = 1.5 V | Ii where Vi = 5.0 V | Idd where Vi = 1.5 V |
|---|---|---|---|
| 0.66 V | 0.8 pA | 5.3 pA | 4.4 µA |

Second Embodiment

Figure 3:
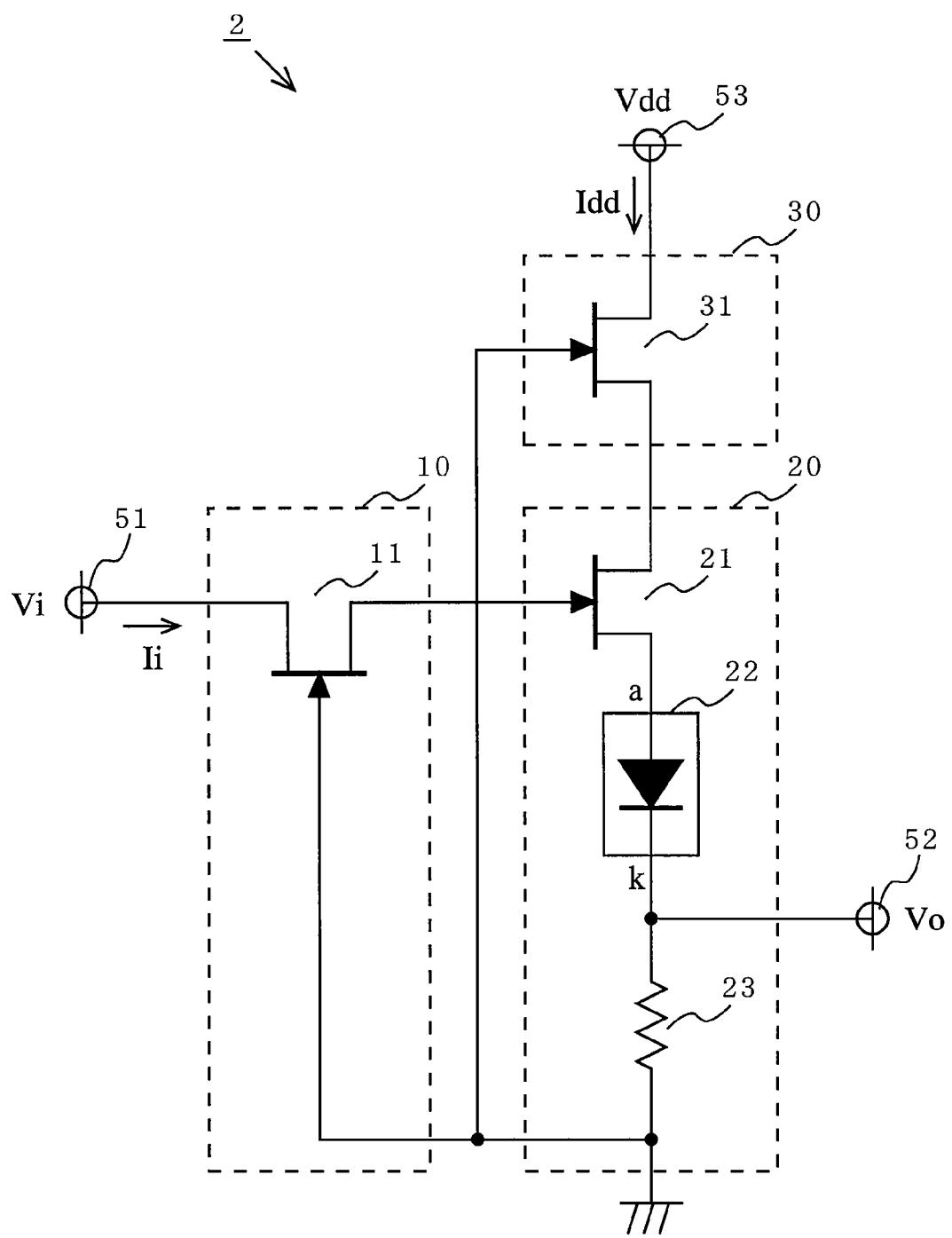
FIG. 3 is a diagram illustrating a structure of a level conversion circuit 2 according to a second embodiment of the present invention.

FIG. 3 is a diagram illustrating a level conversion circuit 2 according to a second embodiment of the present invention. In FIG. 3, the level conversion circuit 2 comprises the gate grounded circuit 10, the source follower circuit 20, and a voltage regulator circuit 30. The gate grounded circuit 10 includes the FET 11 whose gate is grounded for radio-frequency components. The source follower circuit 20 includes the FET 21 whose drain is grounded for radio-frequency components, the level shift circuit 22, and the source follower load resistance 23. The voltage regulator circuit 30 includes a FET 31 whose gate is grounded for radio-frequency components.

As shown in FIG. 3, a structure of the level conversion circuit 2 is different from that of the level conversion circuit 1 in that the level conversion circuit 2 further comprises the voltage regulator circuit 30. Hereinafter, the level conversion circuit 2 will be described mainly with respect to the voltage regulator circuit 30.

A drain of the FET 31 is connected to the power supply terminal 53, while a source of the FET 31 is connected to the drain of the FET 21. Other structural relationships are the same as those of the level conversion circuit 1. The voltage regulator circuit 30 limits a voltage to be supplied to the source follower circuit 20, that is, a value of a drain voltage of the FET 21 in an appropriate manner. Thus, it becomes possible to suppress the inflow current Idd flowing from the power supply terminal 53 to the source follower circuit 20.

Figure 4:
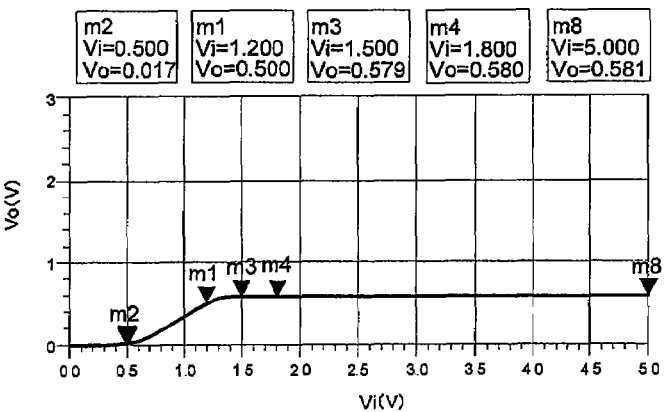
FIG. 4 is a diagram illustrating a simulation result obtained when using the level conversion circuit 2 shown in FIG. 3.
Figure 4:
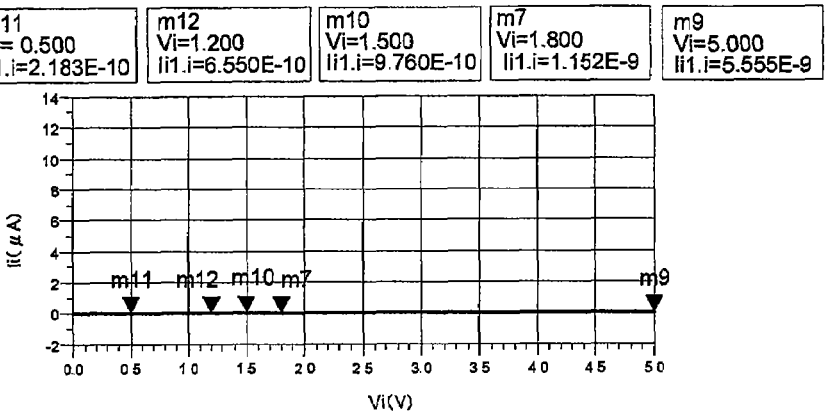
Figure 4:
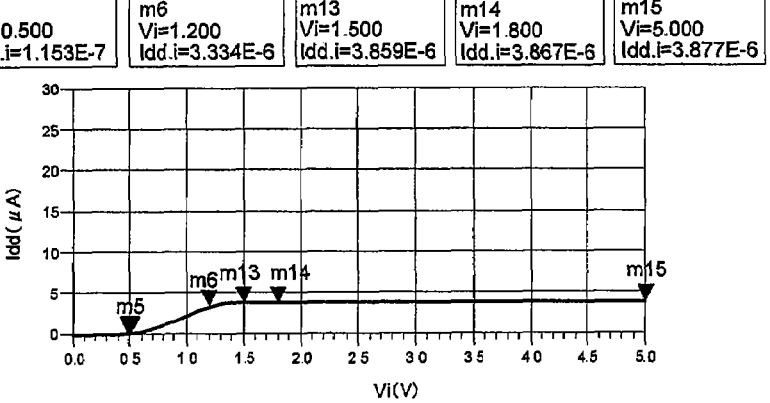

(a) to (c) of FIG. 4 shows a simulation result obtained when using the level conversion circuit 2. The GaAs-MESFET is used as the FET 31, and other conditions are the same as those used for the simulation of the level conversion circuit 1.

(a) of FIG. 4 shows a characteristic of the input voltage Vi versus the output voltage Vo of the level conversion circuit 2. Furthermore, when it is assumed that a logic circuit using an enhancement type GaAs-MESFET is provided subsequent to the level conversion circuit 2 and a threshold value Vth of the logic circuit is +0.2V, a voltage level is set as the input Low level because the output voltage Vo is 0V when the input voltage Vi is within a range from 0 to about 0.4V, while the voltage level is set as the input High level because the output voltage Vo is 0.58V or more when the input voltage Vi is 1.5V or more. Thus, it is possible to realize a level conversion circuit capable of outputting a voltage less than or equal to the threshold value Vth when the voltage level is the input Low level, and also capable of outputting a voltage greater than the threshold value Vth when the voltage level is the input High level.

(b) of FIG. 4 shows a characteristic of the input voltage Vi versus the inflow current Ii of the level conversion circuit 2. When the input voltage Vi is 1.5V, the inflow current Ii is 1.0 pA, which realizes a small current value approximately less than or equal to one-thousandth of that of the conventional level conversion circuit 120 described above. Furthermore, even when the input voltage Vi is 5.0V, the inflow current Ii is 5.6 pA, which is also reduced to one-thousandth of that of the conventional level conversion circuit 120 described above. As described above, in the present invention, it becomes possible to reduce the inflow current Ii to a level close to zero.

(c) of FIG. 4 shows a characteristic of the input voltage Vi versus the inflow current Idd of the level conversion circuit 2. According to (c) of FIG. 4, when the input voltage Vi is 1.5V, the inflow current Idd is 3.9 µA, which is reduced by 0.5 µA as compared with 4.4 µA that is the inflow current Idd of the level conversion circuit 1 when the input voltage Vi is 1.5V.

The simulation result of the level conversion circuit 2 according to the second embodiment is shown in a table 3 below.

TABLE 3

| Vo where Vi = 1.5 V | Ii where Vi = 1.5 V | Ii where Vi = 5.0 V | Idd where Vi = 1.5 V |
|---|---|---|---|
| 0.58 V | 1.0 pA | 5.6 pA | 3.9 µA |

Third Embodiment

Figure 5:
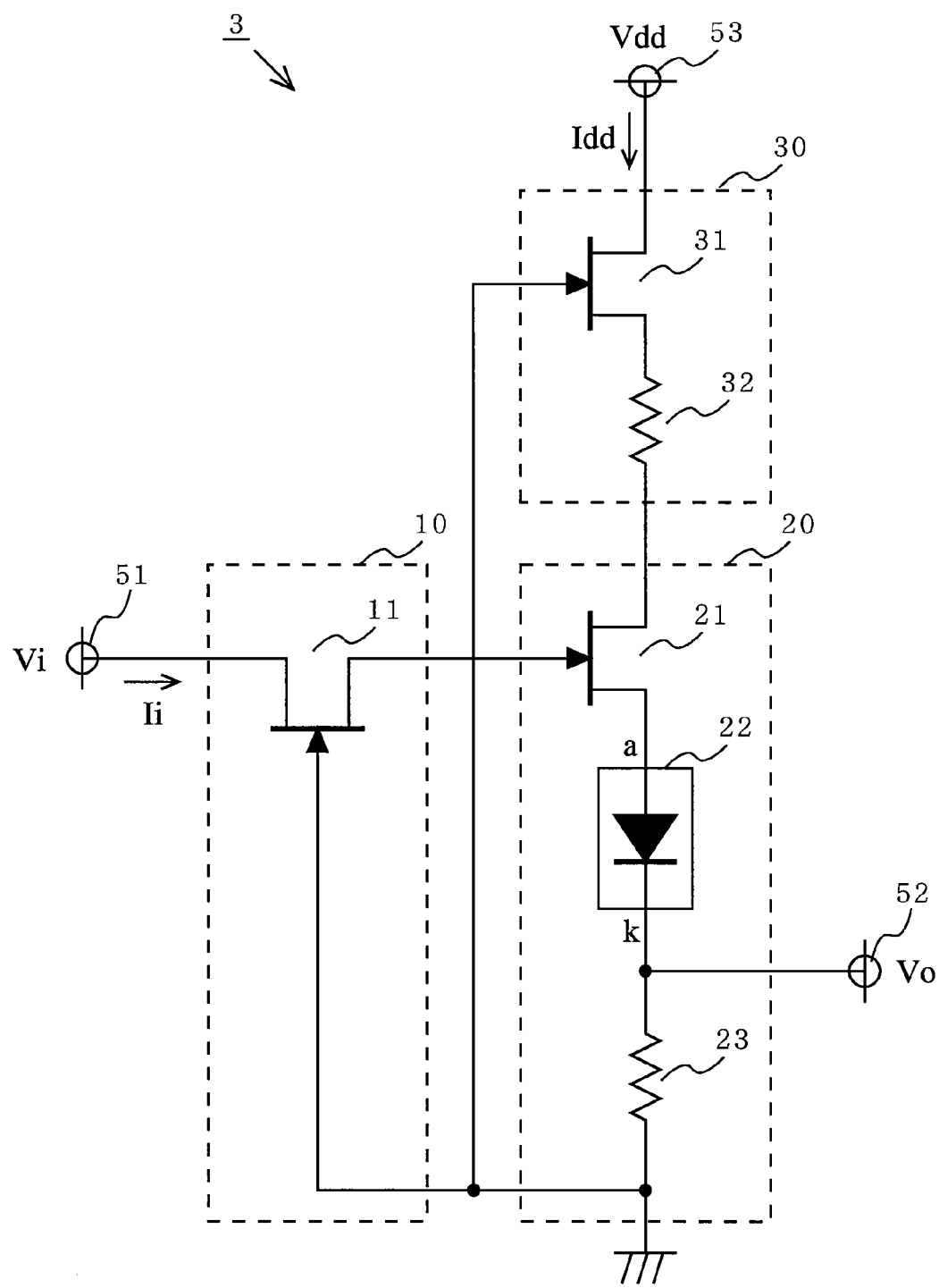
FIG. 5 is a diagram illustrating a structure of a level conversion circuit 3 according to a third embodiment of the present invention.

FIG. 5 is a diagram illustrating a structure of a level conversion circuit 3 according to a third embodiment of the present invention. In FIG. 5, the level conversion circuit 3 comprises the gate grounded circuit 10, the source follower circuit 20, and the voltage regulator circuit 30. The gate grounded circuit 10 includes the FET 11 whose gate is grounded for radio-frequency components. The source follower circuit 20 includes the FET 21 whose drain is grounded for radio-frequency components, the level shift circuit 22, and the source follower load resistance 23. The voltage regulator circuit 30 includes the FET 31 whose gate is grounded, and a regulator resistance 32.

As shown in FIG. 5, a structure of the level conversion circuit 3 is different from that of the level conversion circuit 2 in that the level conversion circuit 3 further comprises the regulator resistance 32. Hereinafter, the level conversion circuit 3 will be described mainly with respect to the regulator resistance 32.

One end of the regulator resistance 32 is connected to a source of the FET 31, while the other end of the regulator resistance 32 is connected to the drain of the FET 21. Other structural relationships are the same as those of the level conversion circuit 2. By providing the regulator resistance 32, the voltage regulator circuit 30 limits a voltage to be supplied to the source follower circuit 20, that is, the value of the drain voltage of the FET 21 in an appropriate manner. Thus, it becomes possible to further suppress the inflow current Idd flowing from the power supply terminal 53 to the source follower circuit 20, as compared with a case where using the level conversion circuit 2.

Figure 6:
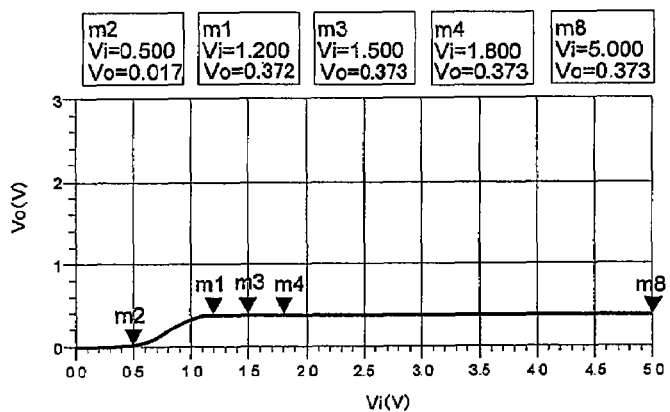
FIG. 6 is a diagram illustrating a simulation result obtained when using the level conversion circuit 3 shown in FIG. 5.
Figure 6:
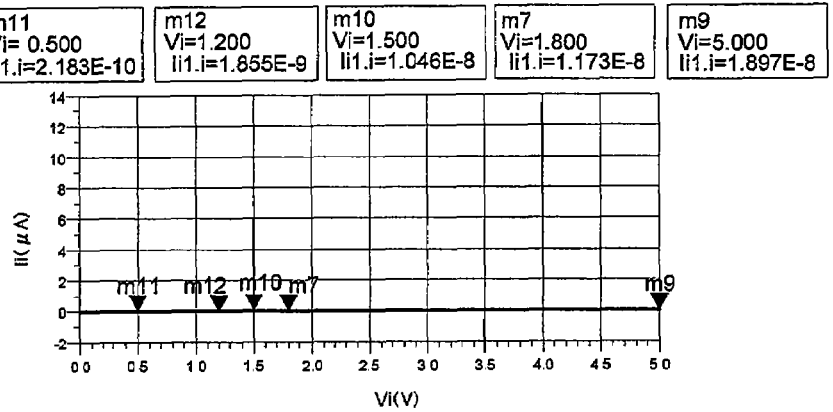
Figure 6:
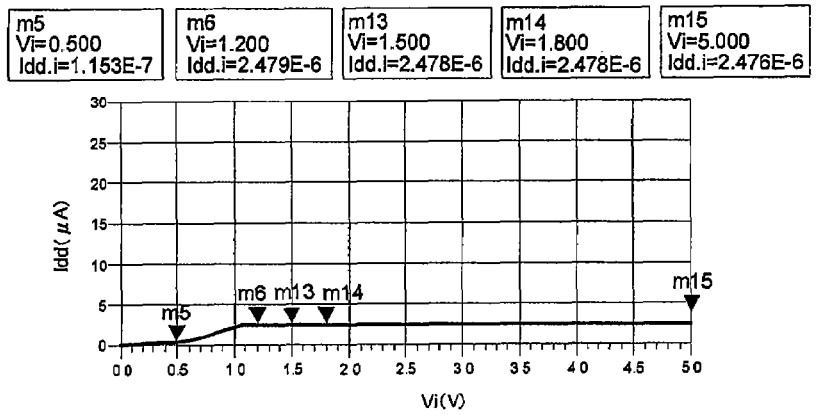

(a) to (c) of FIG. 6 is a diagram illustrating a simulation result obtained when using the level conversion circuit 3. During a simulation, the regulator resistance 32 is set at 100 kΩ, and other conditions are the same as those used for the simulation of the level conversion circuit 2.

(a) of FIG. 6 shows a characteristic of the input voltage Vi versus the output voltage Vo of the level conversion circuit 3. Furthermore, when it is assumed that a logic circuit using an enhancement type GaAs-MESFET is provided subsequent to the level conversion circuit 3 and a threshold value Vth of the logic circuit is +0.2V, a voltage level is set as the input Low level because the output voltage Vo is 0V when the input voltage Vi is within a range from 0 to about 0.4V, while the voltage level is set as the input High level because the output voltage Vo is 0.37V or more when the input voltage Vi is 1.5V or more. Thus, it is possible to realize a level conversion circuit capable of outputting a voltage less than or equal to the threshold value Vth when the voltage level is the input Low level, and also capable of outputting a voltage greater than the threshold value Vth when the voltage level is the input High level.

(b) of FIG. 6 shows a characteristic of the input voltage Vi versus the inflow current Ii of the level conversion circuit 3. When the input voltage Vi is 1.5V, the inflow current Ii is 10.5 pA, which is greater than that of the level conversion circuit 1, but still realizes a small current value approximately less than or equal to one-thousandth of that of the conventional level conversion circuit 120 described above. As described above, in the present invention, it becomes possible to reduce the inflow current Ii to a level close to zero.

(c) of FIG. 6 shows a characteristic of the input voltage Vi versus the inflow current Idd of the level conversion circuit 3. According to (c) of FIG. 6, when the input voltage Vi is 1.5V, the in flow current Idd is 2.5 µA, which is reduced by 1.9 µA as compared with 4.4 µA that is the inflow current Idd of the level conversion circuit 1 when the input voltage Vi is 1.5V.

The simulation result of the level conversion circuit 3 according to the third embodiment is shown in a table 4 below.

TABLE 4

| Vo where Vi = 1.5 V | Ii where Vi = 1.5 V | Ii where Vi = 5.0 V | Idd where Vi = 1.5 V |
|---|---|---|---|
| 0.37 V | 10.5 pA | 19.0 pA | 2.5 µA |

Fourth Embodiment

Figure 7:
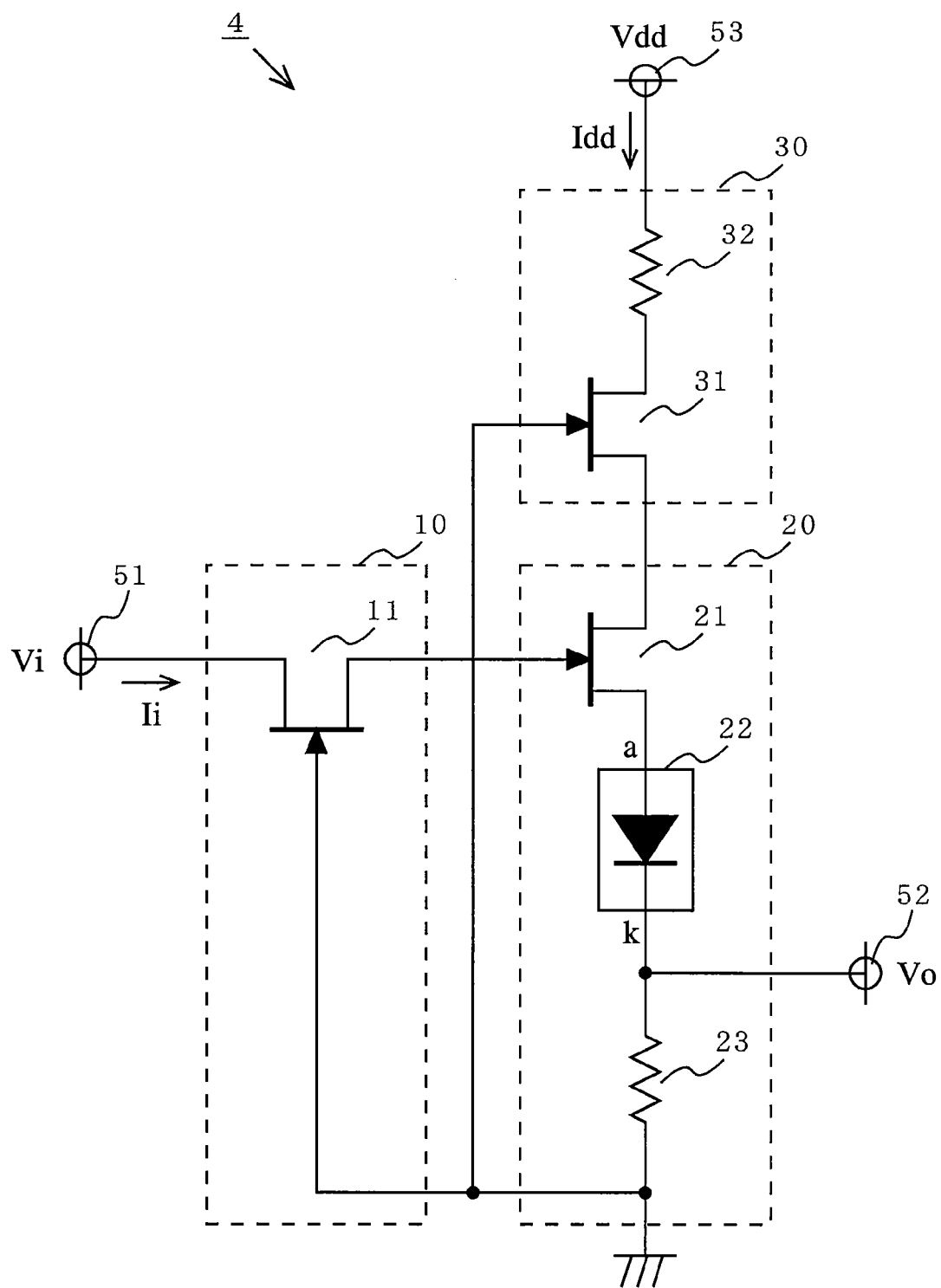
FIG. 7 is a diagram illustrating a structure of a level conversion circuit 4 according to a fourth embodiment of the present invention.

FIG. 7 is a diagram illustrating a structure of a level conversion circuit 4 according to a fourth embodiment of the present invention. In FIG. 7, the level conversion circuit 4 comprises the gate grounded circuit 10, the source follower circuit 20 and the voltage regulator circuit 30. The gate grounded circuit 10 includes the FET 11 whose gate is grounded for radio-frequency components. The source follower circuit 20 includes the FET 21 whose drain is grounded for radio-frequency components, the level shift circuit 22 and the source follower load resistance 23. The voltage regulator circuit 30 includes the FET 31 whose gate is grounded, and the regulator resistance 32.

As shown in FIG. 7, a structure of the level conversion circuit 4 is the same as that of the level conversion circuit 3 except for a position at which the regulator resistance 32 is inserted. One end of the regulator resistance 32 is connected to the power supply terminal 53, while the other end of the regulator resistance 32 is connected to a drain of the FET 31. Other structural relationships are the same as those of the level conversion circuit 3.

Figure 8:
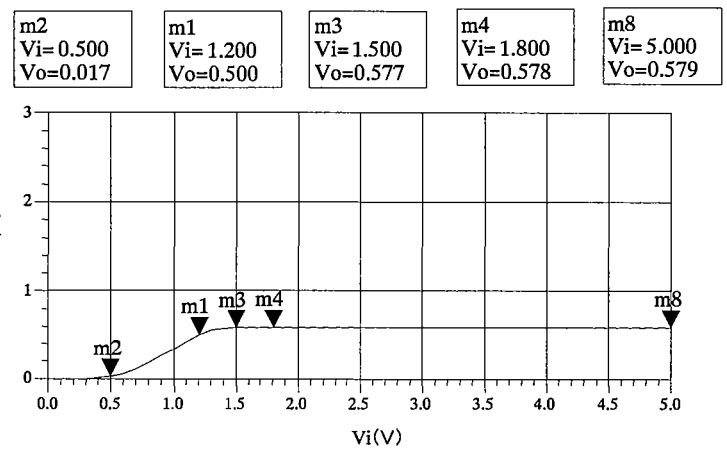
FIG. 8 is a diagram illustrating a simulation result obtained when using the level conversion circuit 4 shown in FIG. 7.
Figure 8:
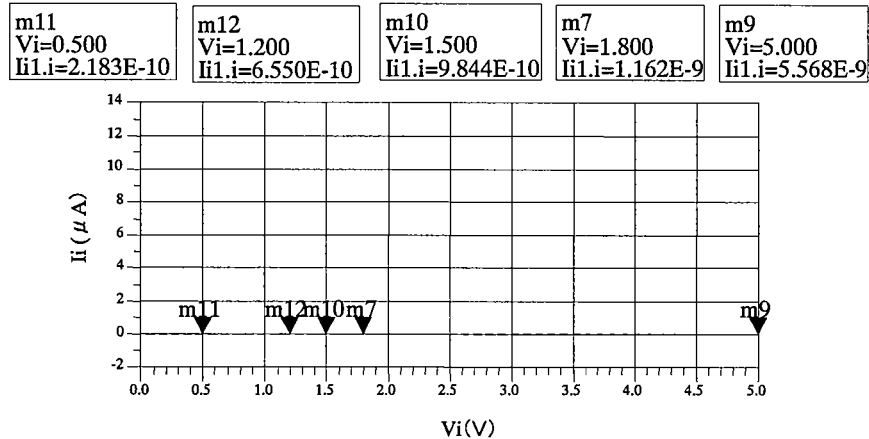
Figure 8:
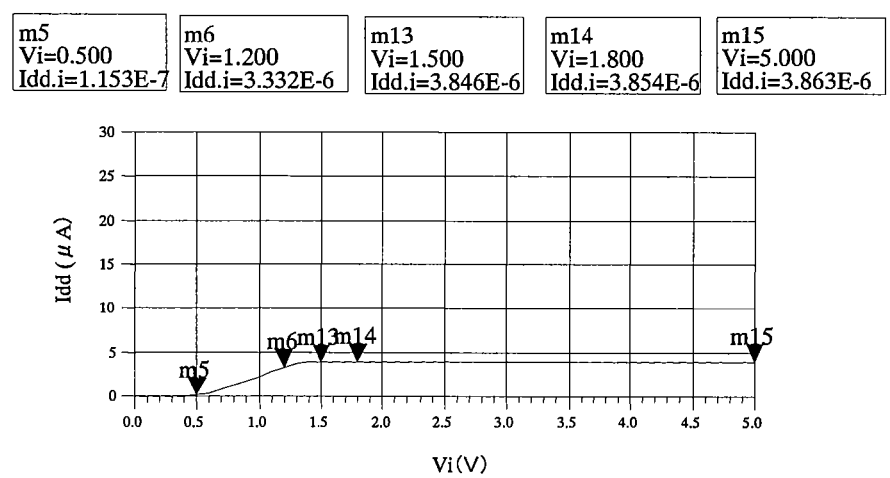

(a) to (c) of FIG. 8 is a diagram illustrating a simulation result obtained when using the level conversion circuit 4. The conditions used for the simulation are the same as those for the simulation of the level conversion circuit 3.

(a) of FIG. 8 shows a characteristic of the input voltage Vi versus the output voltage Vo of the level conversion circuit 4. Furthermore, when it is assumed that a logic circuit using an enhancement type GaAs-MESFET is provided subsequent to the level conversion circuit 4 and a threshold value Vth of the logic circuit is +0.2V, a voltage level is set as the input Low level because the output voltage Vo is 0V when the input voltage Vi is within a range from 0 to about 0.4V, while the voltage level is set as the input High level because the output voltage Vo is 0.58V or more when the input voltage Vi is 1.5V or more. Thus, it is possible to realize a level conversion circuit capable of outputting a voltage less than or equal to the threshold value Vth when the voltage level is the input Low level, and also capable of outputting a voltage greater than the threshold value Vth when the voltage level is the input High level.

(b) of FIG. 8 shows a characteristic of the input voltage Vi versus the inflow current Ii of the level conversion circuit 4. When the input voltage Vi is 1.5V, the inflow current Ii is 0.98 pA, thereby making it possible to reduce the inflow current Ii to a level close to zero.

(c) of FIG. 8 shows a characteristic of the input voltage Vi versus the inflow current Idd of the level conversion circuit 4. When the input voltage Vi is 1.5V, the inflow current Idd is 3.9 µA, which is greater than 2.5 µA of the level conversion circuit 3 and thus producing less effect than the level conversion circuit 3.

The simulation result of the level conversion circuit 4 according to the fourth embodiment is shown in a table 5 below.

TABLE 5

| Vo where Vi = 1.5 V | Ii where Vi = 1.5 V | Ii where Vi = 5.0 V | Idd where Vi = 1.5 V |
| --- | --- | --- | --- |
| 0.58 V | 0.98 pA | 5.6 pA | 3.9 µA |

As described above, according to the level conversion circuits 1 to 4 of the respective first to fourth embodiments of the present invention, by combining the gate grounded circuit 10, the source follower circuit 20 and the voltage regulator circuit 30 together, it becomes possible to reduce the inflow current Ii flowing from the input terminal 51 to a level close to zero without increasing the chip area.

Figure 9:
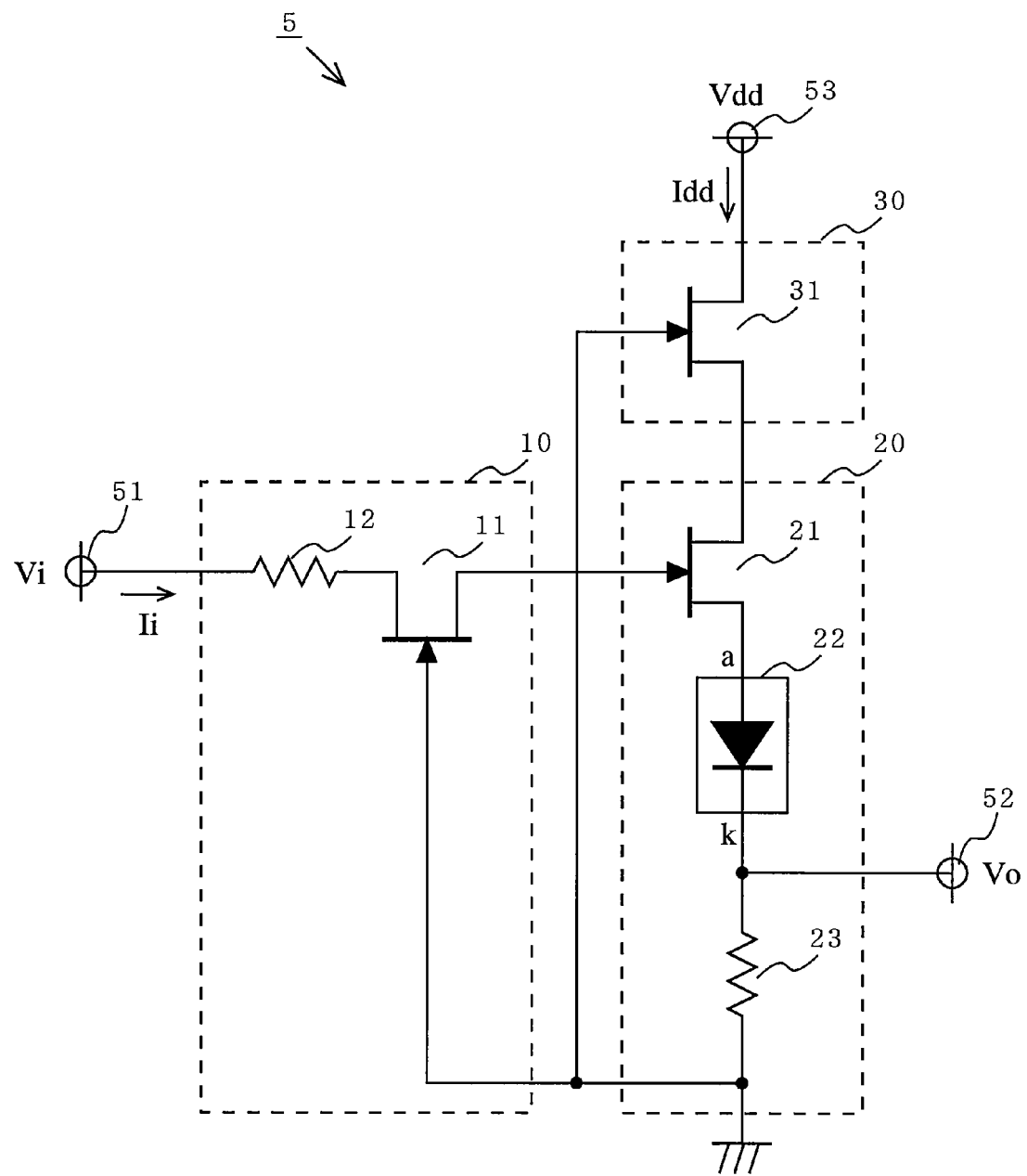
FIG. 9 is a diagram illustrating another structure of a level conversion circuit 5 according to the second embodiment.
Figure 10:
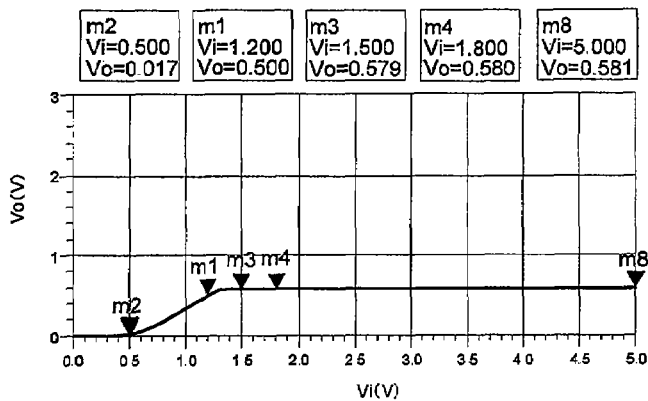
FIG. 10 is a diagram illustrating a simulation result obtained when using the level conversion circuit 5 shown in FIG. 9.
Figure 10:
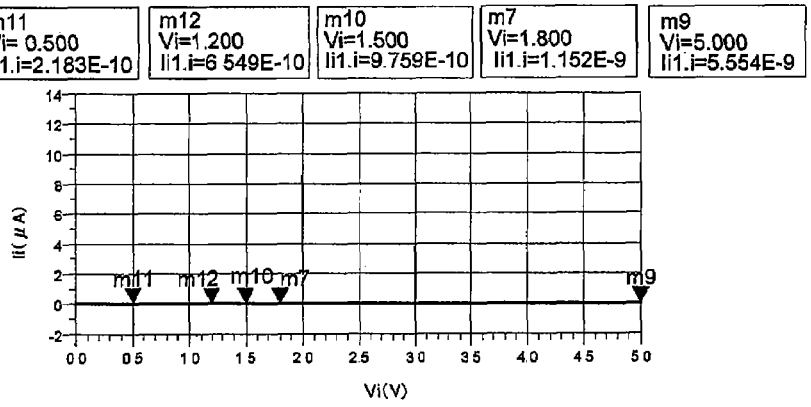
Figure 10:
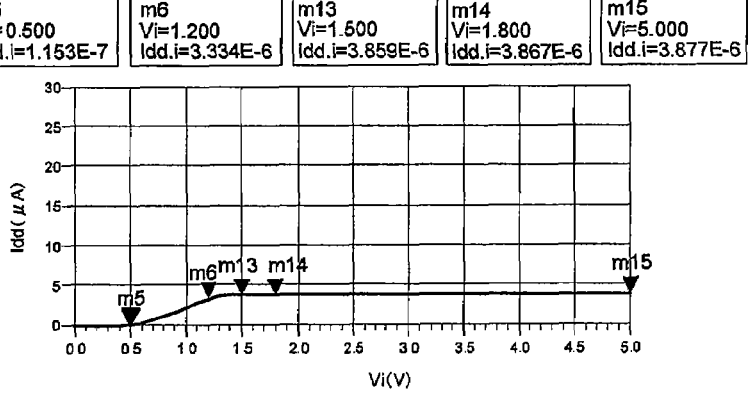

Note that in order to improve an anti-surge characteristic of the gate grounded circuit 10, a resistance 12 may be inserted between the input terminal 51 and the source of the FET 11. The higher a resistance value of the resistance 12 is, the more the anti-surge characteristic is improved. FIG. 9 is a diagram illustrating a level conversion circuit 5 in which the resistance 12 is inserted in the level conversion circuit 2. Similarly to the level conversion circuit 2, however, it is possible to insert the resistance 12 in each of the level conversion circuits 1, 3 and 4. (a) to (c) of FIG. 10 is a diagram illustrating a simulation result obtained when using the level conversion circuit 5 shown in FIG. 9. Regardless of the presence or absence of the resistance 12, there is no remarkable difference in the simulation result (this is because a current does not flow due to the high impedance). The conditions used for the simulation are the same as those used for the simulation of the level conversion circuit 2.

Figure 11:
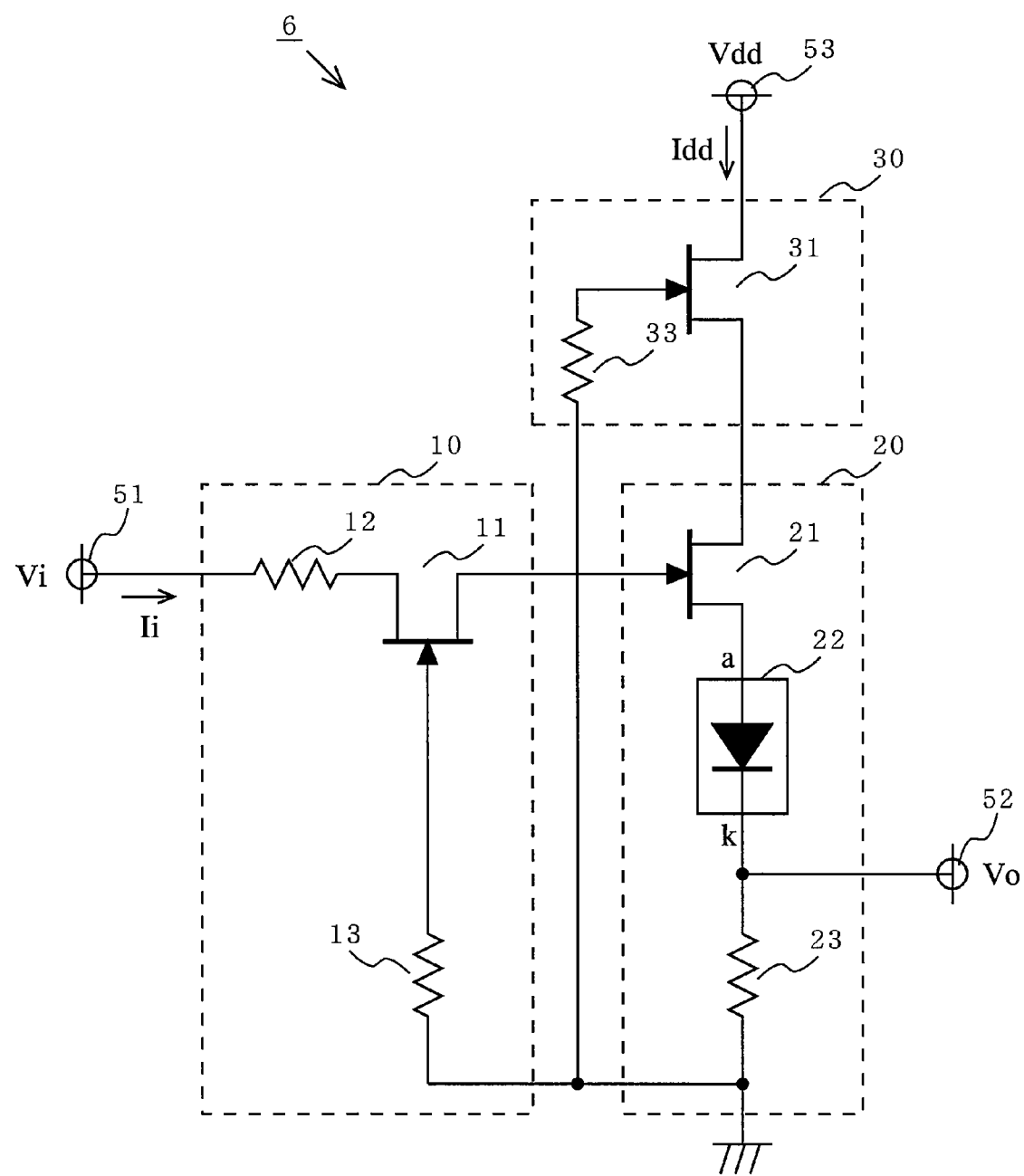
FIG. 11 is a diagram illustrating another structure of a level conversion circuit 6 according to the second embodiment.
Figure 12:
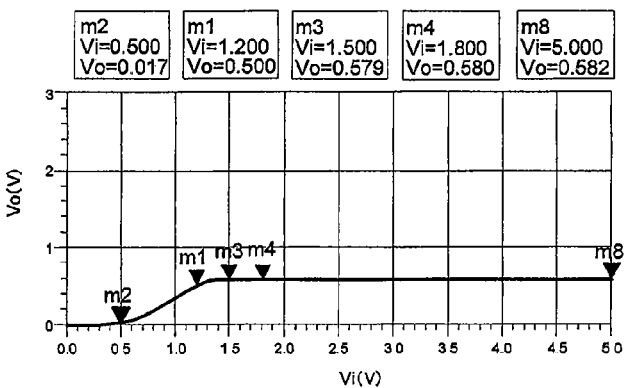
FIG. 12 is a diagram illustrating a simulation result obtained when using the level conversion circuit 6 shown in FIG. 11.
Figure 12:
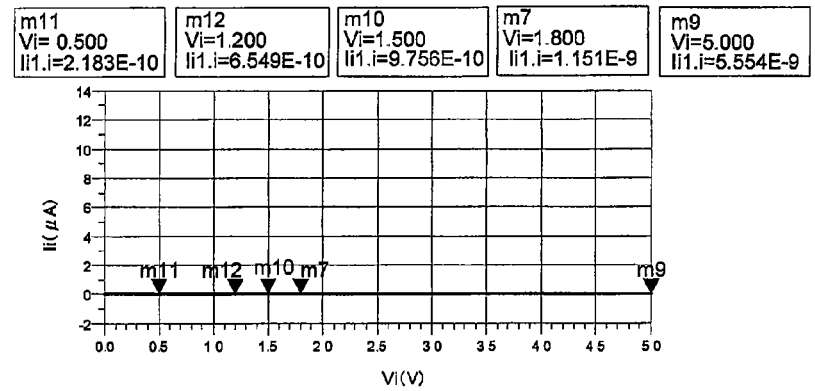
Figure 12:
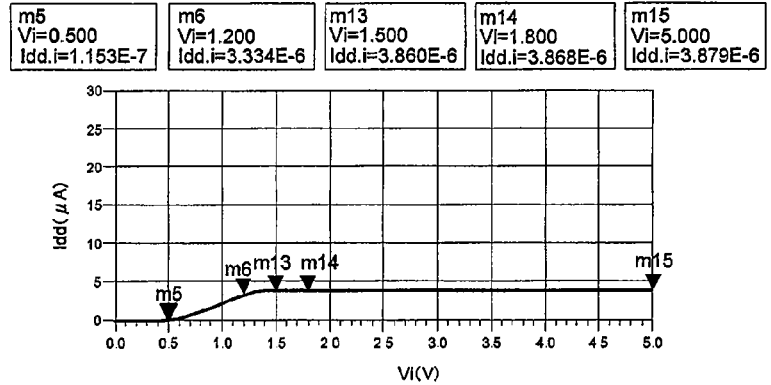

Alternatively, in order to improve the anti-surge characteristic of the gate grounded circuit 10 and the voltage regulator circuit 30, resistances 13 and 33 may be inserted to gates of the FETs 11 and 31, respectively. FIG. 11 is a diagram illustrating a structure of a level conversion circuit 6 in which the resistances 13 and 33 are inserted in the level conversion circuit 2. Similarly to the level conversion circuit 2, however, it is possible to insert the resistances 13 and 33 in each of the level conversion circuits 1, 3 and 4. (a) to (c) of FIG. 12 is a diagram illustrating a simulation result obtained when using the level conversion circuit 6 shown in FIG. 11. Regardless of the presence or absence of the resistances 13 and 33, there is no remarkable difference in the simulation result (this is because a current does not flow due to the high impedance). The conditions used for the simulation are the same as those used for the simulation of the level conversion circuit 2 except that each of the resistances 13 and 33 is set at 1 kΩ.

While the invention has been described in detail, the foregoing description is in all aspects illustrative and not restrictive. It is understood that numerous other modifications and variations can be devised without departing from the scope of the invention.

What is claimed is:

1. A level conversion circuit which converts a level of an input voltage and outputs a voltage whose level has been converted, comprising:
    a first transistor having a gate thereof grounded, for inputting the input voltage to a source thereof and outputting an output voltage from a drain thereof;
    a third transistor having a gate thereof grounded and a drain thereof to which a power supply voltage is applied, for outputting, from a source thereof, the output voltage determined by the power supply voltage;
    a second transistor for inputting the output voltage outputted from the source of the third transistor to a drain thereof, inputting the output voltage outputted from the drain of the first transistor to a gate thereof, and outputting, from a source thereof, the output voltage determined by the power supply voltage;
    a level shift circuit for inputting the output voltage outputted from the source of the second transistor to an input end thereof and outputting, from an output end thereof, a voltage whose level is shifted by a predetermined amount; and
    a resistance inserted between the output end of the level shift circuit and a ground.

2. The level conversion circuit according to claim 1, wherein each of the first, second and third transistors is a gallium arsenide metal semiconductor field-effect transistor.

3. The level conversion circuit according to claim 1, wherein the level shift circuit is a diode.

4. The level conversion circuit according to claim 1, wherein the level shift circuit uses a gallium arsenide metal semiconductor field-effect transistor having a Schottky gate as a diode.

5. A semiconductor integrated circuit, wherein a semiconductor chip on which the level conversion circuit according to claim 1 is integrated is the same as that on which a radio-frequency signal switching device to which the level conversion circuit is connected to.

6. A level conversion circuit which converts a level of an input voltage and outputs a voltage whose level has been converted, comprising:

a first transistor having a gate thereof grounded, for inputting the input voltage to a source thereof and outputting an output voltage from a drain thereof;

a third transistor having a gate thereof grounded and a drain thereof to which a power supply voltage is applied, for outputting, from a source thereof, the output voltage determined by the power supply voltage;

a second resistance for inputting the output voltage outputted from the source of the third transistor to an input end thereof and outputting, from an output end thereof, the output voltage determined by the power supply voltage;

a second transistor having a drain thereof connected to the output end of the second resistance, for inputting the output voltage outputted from the drain of the first transistor to a gate thereof and outputting, from a source thereof, the output voltage determined by the power supply voltage;

a level shift circuit for inputting the output voltage outputted from the source of the second transistor to an input end thereof and outputting, from an output end thereof, a voltage whose level is shifted by a predetermined amount; and a first resistance inserted between an output end of the level shift circuit and a ground.

7. The level conversion circuit according to claim 6, wherein each of the first, second and third transistors is a gallium arsenide metal semiconductor field-effect transistor.

8. The level conversion circuit according to claim 6, wherein the level shift circuit is a diode.

9. The level conversion circuit according to claim 6, wherein the level shift circuit uses a gallium arsenide metal semiconductor field-effect transistor having a Schottky gate as a diode.

10. A semiconductor integrated circuit, wherein a semiconductor chip on which the level conversion circuit according to claim 6 is integrated is the same as that on which a radio-frequency signal switching device to which the level conversion circuit is connected to.

* * * * *